United States Patent
Tomiie et al.

(10) Patent No.: US 6,963,107 B2
(45) Date of Patent: Nov. 8, 2005

(54) NONVOLATILE SEMICONDUCTOR MEMORY APPARATUS AND THE OPERATION METHOD

(75) Inventors: Hideto Tomiie, Kanagawa (JP); Shinji Satoh, Nagasaki (JP); Kazumasa Nomoto, Kanagawa (JP)

(73) Assignee: Sony Corporation, Tokyo (JP)

( * ) Notice: Subject to any disclaimer, the term of this patent is extended or adjusted under 35 U.S.C. 154(b) by 12 days.

(21) Appl. No.: 10/744,797

(22) Filed: Dec. 23, 2003

(65) Prior Publication Data

US 2005/0036391 A1    Feb. 17, 2005

(30) Foreign Application Priority Data

Dec. 27, 2002  (JP) ............................. P2002-381211

(51) Int. Cl.[7] ........................................... H01L 29/792
(52) U.S. Cl. ...................... 257/324; 257/298
(58) Field of Search ................. 257/298, 324

(56) References Cited

U.S. PATENT DOCUMENTS

| 4,241,424 A | * | 12/1980 | Dickson et al. | ............. 365/195 |
| 5,424,567 A | * | 6/1995 | Chen | ......................... 257/315 |
| 5,753,958 A | * | 5/1998 | Burr et al. | .................. 257/392 |

* cited by examiner

Primary Examiner—Allan R. Wilson
(74) Attorney, Agent, or Firm—Sonnenschein, Nath & Rosenthal LLP

(57) ABSTRACT

A nonvolatile semiconductor memory apparatus capable of attaining a low voltage when writing data, wherein charge injection into an unnecessary portion is not performed when reading, and capable of unifying a threshold voltage level when erasing, comprising a first conductive type semiconductor region, two source/drain regions made by a second conductive type semiconductor, a plurality of dielectric films stacked on a first conductive type semiconductor region between the two source/drain regions, and a gate electrode; wherein the first conductive type semiconductor region between the two source/drain regions includes a first region wherein a channel is formed by an inversion layer of a minority carrier and a second region formed between the first region and a source/drain region on one side of the first region and having higher concentration than that of the first region.

6 Claims, 10 Drawing Sheets

2ch: FIRST REGION  }  SECOND CONDUCTIVE (p)
7: SECOND REGION  }  TYPE SEMICONDUCTOR
3A, 3B: SOURCE/DRAIN REGION
4: A PLURALITY OF DIELECTRIC FILMS (CHARGE STORING FILM)
5: GATE ELECTRODE
MA: MEMORY PORTION

POTENTIAL

ELECTRIC FIELD

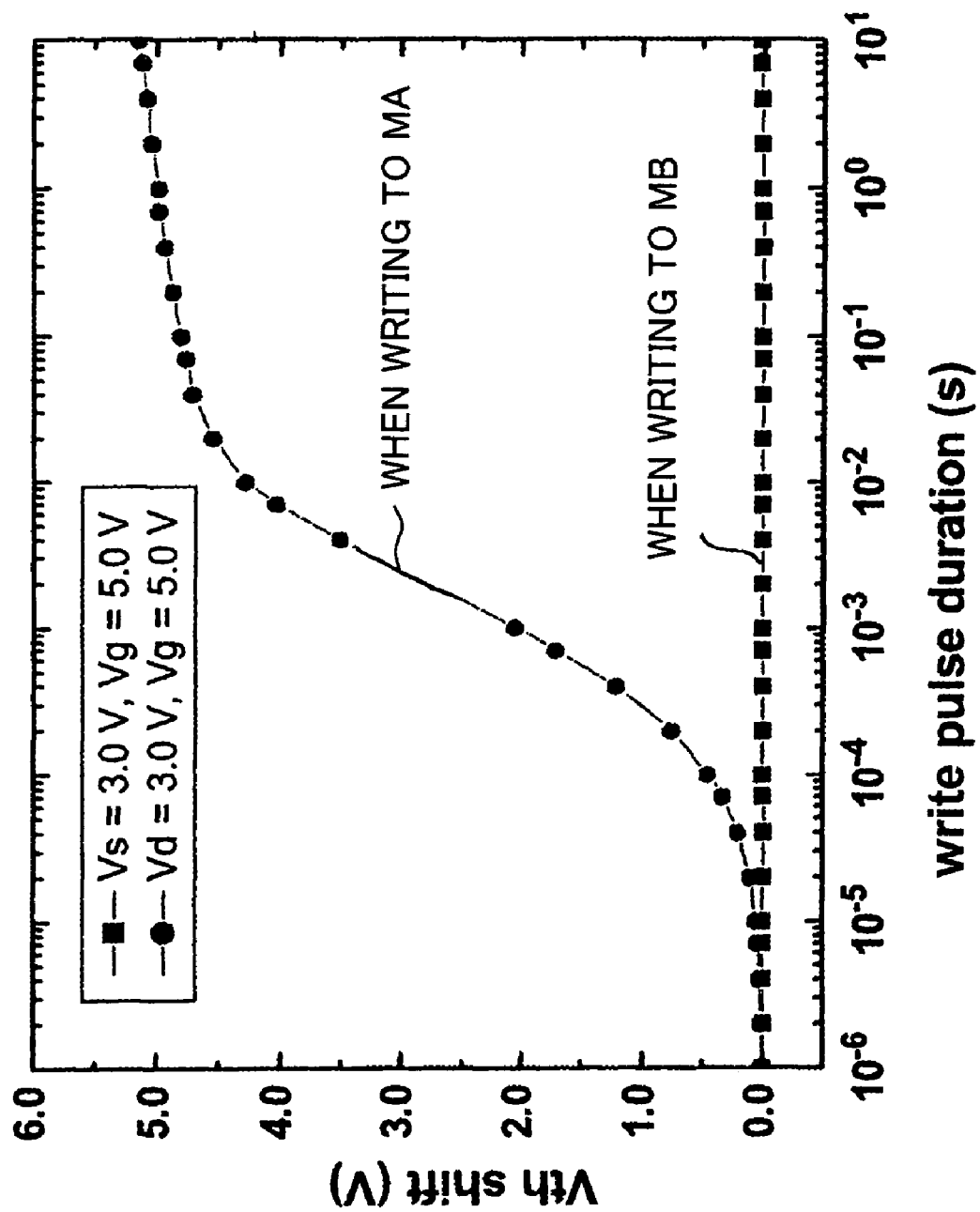

NONVOLATILE SEMICONDUCTOR MEMORY APPARATUS AND THE OPERATION METHOD

BACKGROUND OF THE INVENTION

1. Field of the Invention

The present invention relates to a nonvolatile semiconductor memory for storing data by trapping charges in a plurality of dielectric films, and an operation method thereof.

2. Description of the Related Art

A nonvolatile semiconductor memory is a semiconductor memory having nonvolatile property, highly integrating property and an electric rewriting function. In a so called Erasable and Electrically Programmable Read Only Memory (EEPROM), a Floating Gate (FG) type wherein a conductor called a floating gate is provided on a gate insulation film in a state of being completely surrounded by oxide films, etc. to be electrically insulated and charges are stored in the floating gate, a Metal-Oxide-Nitride-Oxide-Semiconductor (MONOS) type and a Metal-Nitride-Oxide-Semiconductor (MNOS) type wherein a charge storing film obtained by stacking a plurality of dielectric films is provided and data is stored by controlling a charge amount to be stored in charge traps in the charge storing film are known.

As a method of injecting the charges to the charge storing film, other than using a tunneling phenomenon of charges in a dielectric film, there is a method of energetically exciting charges to an extent of becoming capable of getting over an insulation barrier of a lowermost layer of the dielectric films, such as so called Cannel Hot Electron (CHE) injection (for example, refer to "Electron Device Letter (EDL)" EDL-21, 2000, p.543 written by Boaz Eitan, issued by the Institute of Electrical and Electronics Engineers (IEEE)).

In a nonvolatile memory described in the quoted article, by using as a reference a potential of an N-type impurity diffusion region (for example, 0V) contacting one over a P-type semiconductor region wherein a channel is formed by an N-type inversion layer with minority carriers, a writing drain voltage of, for example, 4 to 5V is applied to the other N-type impurity diffusion region, and in that state, a writing pulse (writing gate voltage) of, for example, 10V or so is applied to the gate electrode. As a result, electrons are supplied into the channel from one impurity diffusion region being applied 0V to serve as a source and accelerated in the channel, so that hot electrons are generated at the channel end of the drain side. The hot electrons are injected from the channel end of the drain side to the charge storing film (ONO film).

When reading data, roles of the source and the drain are reversed from those in the above writing, a reading drain voltage (for example, 1.5V) is applied between the two impurity diffusion regions and a reading gate voltage (for example, 3.0V) is applied to the gate electrode. During writing, a threshold voltage of a memory cell transistor varies in accordance with a charge storage amount on the source side. Thus, a memory transistor turns on or off in accordance with the charge storage amount on the source side under the condition that a voltage at the time of the above reading is applied, and the information is detected by a sense amplifier, etc. This reading method is called a reverse read method because the electric field direction of the source and the drain is reversed from those at the time of writing. In the above quoted article, two-bit data is stored in one cell by injecting several hundreds of electrons respectively to both ends of the charge storing film, and two-bit data is read by the reverse read performed twice by reversing the source and the drain.

When erasing data, a positive voltage is applied to an impurity diffusion region on the side in which electrons desired to be erased are stored and a negative voltage is applied to the gate, so that hot holes are generated by band-to-band tunneling on the impurity diffusion region side and the hot holes are injected to a part of the charge storing film storing the electrons to be erased so as to erase the data. In the above quoted article, two-bit data is erased by performing this operation twice by switching the impurity diffusion region to be applied with the positive voltage.

There are problems below in a nonvolatile memory apparatus described in the quoted article.

First, while a MONOS type memory transistor of the related art was capable of using a lower voltage than that in the FG type, an efficiency of CHE injection of electrons at the time of writing data was poor and the voltage was not low enough, that is, a voltage of nearly 10V was necessary. Therefore, a transistor having a high breakdown voltage was required in a peripheral circuit of the memory, so that the production process became complicated and a reduction of the production cost became difficult. Also, delay of a pulse and a power consumption were large and usage of the nonvolatile memory apparatus was limited.

Secondary, it is also possible to lower the voltage by improving the CHE injection efficiency by optimizing the ONO film and the impurity regions, however, in that case, read disturbance at the time of a reading operation becomes notable because writing is a low voltage operation. That is, at the time of reading a change of a threshold voltage in accordance with a storing charge amount on the source side when reading data, in the case where a writing voltage is made low, weak writing is liable to be caused by an electric field imposed on the end portions of the charge storing film on the drain side. Thus, while repeating the reading for many times, there is a disadvantage that an unignorable amount of electrons are forcibly injected on the drain side and data is destroyed in the worst case.

Thirdly, there are disadvantages on erasing as below.

In an erasing operation of electrically canceling by injecting hot holes charges written in a part of the end of the drain side by the CHE injection, when the erasure is not sufficient, a threshold voltage of the memory transistor becomes that of the written region. While, when the erasure is sufficiently done, excessive erasure is caused, that is, the threshold of the erased region becomes lower than that of an initial channel-forming region wherein no writing is performed. When the excessive erasure is caused, the threshold voltage of the memory cell transistor is mostly determined by that of the channel-forming region.

The threshold voltage of the channel-forming region is adjusted by ion implantation on the initial stage of the process, but it is liable to vary in a memory cell array or between wafers because the concentration is relatively low in the ion implantation at this time and the threshold voltage is easily changed due to thermal transition of processes after that. When determining an erasure condition by aiming a threshold voltage level on the boundary of causing the excessive erasure and attempting sufficient erasure as much as possible, the excessive erasure is always caused in a part of the memory cell transistor and the threshold voltage of the memory transistor tends to vary thereby.

On the other hand, when erasure is not done much so as not to even partially cause the excessive erasure, the threshold voltage at a low level of the memory cell in this case becomes that of a data written region. However, the threshold in the middle of erasure when the erasure is not completely done is sensible to changes of an erasure time and easily affected by pulse delay, so that it tends to largely vary. Furthermore, in this case, a threshold voltage difference between writing and erasing is not secured much, so an operation at a low voltage becomes difficult.

Namely, in the memory cell structure of the related art, the threshold voltage at erasure largely varies regardless of controlling of an erasure time at the last analysis.

The third disadvantage is expected to be furthermore important as a significant matter in pursuing a lower voltage in the future. When pursuing a lower voltage in this way, eventually, complicated control of unifying an erasure level for every bit, etc. will be required and it may result in a state of not being capable of shortening a data rewriting time or causing a longer data rewriting time.

SUMMARY OF THE INVENTION

An object of the present invention is to provide a nonvolatile semiconductor memory apparatus having the configuration capable of attaining a low voltage when writing data, wherein charge injection into an unnecessary portion is not performed when reading, and capable of unifying a threshold voltage level when erasing, and an operation method thereof (methods of data writing, reading and erasing).

According to the present invention, there is provided a nonvolatile semiconductor memory apparatus, comprising a first conductive type semiconductor region; two source/drain regions formed being away from each other on a surface portion of the first conductive type semiconductor region and made by a second conductive type semiconductor; a plurality of dielectric films stacked on the first conductive type semiconductor region between the two source/drain regions; and a gate electrode formed on the plurality of dielectric film; wherein the first conductive type semiconductor region between the two source/drain regions includes a first region wherein a channel is formed by an inversion layer of minority carrier and a second region formed between the first region and the source/drain region on one side of the first region and having higher concentration than that of the first region.

According to the present invention, there is provided a first operation method of a nonvolatile semiconductor memory apparatus comprising a first conductive type semiconductor region; two source/drain regions formed being away from each other on a surface portion of the first conductive type semiconductor region and made by a second conductive type semiconductor; a plurality of dielectric films stacked on the first conductive type semiconductor region between the two source/drain regions; and a gate electrode formed on the plurality of dielectric films; wherein the first conductive type semiconductor region between the two source/drain regions includes a first region wherein a channel is formed by an inversion layer of minority carrier, and a second region formed between the first region and the source/drain region on one side of the first region and having higher concentration than that of the first region, wherein when writing data, by using a potential of a source/drain region on the first region side among the two source/drain regions as a reference, a writing drain voltage is applied to a source/drain region on the second region, a writing gate voltage is applied to the gate electrode, and the minority carriers accelerated in the channel and energetically excited near an end portion of the second region are injected to a part of the plurality of dielectric films near an upper portion of the second region; and when reading data, by using a potential of the source/drain region on the second region side as a reference, a reading drain voltage is applied to the other source/drain region on the first region side, a reading gate voltage is applied to the gate electrode, and a change of electric conductivity of different channel is read in accordance with whether the minority carriers are sufficiently injected to a part of the plurality of dielectric films at the time of the writing data.

According to the present invention, there is provided a second operation method of a nonvolatile semiconductor memory apparatus comprising a first conductive type semiconductor region; two source/drain regions formed being away from each other on a surface portion of the first conductive type semiconductor region and made by a second conductive type semiconductor; a plurality of dielectric films stacked on the first conductive type semiconductor region between the two source/drain regions; and a gate electrode formed on the plurality of dielectric films; wherein the first conductive type semiconductor region between the two source/drain regions includes a first region wherein a channel is formed by an inversion layer of minority carrier, and a second region formed between the first region and the source/drain region on one side of the first region and having higher concentration than that of the first region, wherein when writing data, by using a potential of a source/drain region on the first region side among the two source/drain regions as a reference, a writing drain voltage is applied to a source/drain region on the second region, a writing gate voltage is applied to the gate electrode, and the minority carriers accelerated in the channel and energetically excited near an end portion of the second region are injected to a part of the plurality of dielectric film near an upper portion of the second region; and when erasing data, by using a potential of the first region as a reference, a positive voltage is applied to the source/drain region on the second region side, a negative voltage is applied to the gate electrode, charges generated by a band-to-band tunneling current on the source/drain region side on the second region side, energetically excited and having an opposite polarity from that of the minority carriers are injected to a part of the plurality of dielectric films to which the minority carriers are injected at least at the time of the writing data.

In the nonvolatile semiconductor memory apparatus of the present invention, a charge trap is provided as a so called dispersed charge storing means in a plurality of dielectric films. The plurality of dielectric films are formed on a first conductive type semiconductor region. The first conductive type semiconductor region is provided with a first region wherein a channel is formed by an inversion layer of minority carriers and a first conductive type second region between the first region and a source/drain region. The second region is formed only on one side of two source/drain regions and has higher impurity concentration than that in the first region.

As a result that the second region is formed only on one side of the two source/drain regions, a variety of effects below are obtained at the time of writing, reading and erasing data.

When writing data, a writing drain voltage is applied to a source/drain region on the second region side by using a potential of other source/drain region as a reference, and a writing gate voltage is applied to the gate electrode. Consequently, minority carriers for the first conductive type semiconductor region are supplied from the source/drain region used as a reference of potential and accelerated by an electric field in the channel direction in the first region. The minority carriers obtain high energy near the end of a drain side of the first region, get over a potential barrier of a plurality of dielectric films and are injected into the plurality of dielectric films. At this time, convergence of the electric field in the channel direction becomes high near the end of the drain side of the first region due to an existence of the second region, and more charges are effectively injected into the plurality of dielectrics.

When reading data, a reading drain voltage is applied by using the source/drain region on the second region side as a source and the other source/drain region as a drain. The gate electrode is applied with a predetermined reading gate voltage. In the same way as in the writing, at this time, convergence of the electric field in the channel direction becomes high at a part due to an existence of the second region. Note that the part where the convergence becomes high in this electric field is on the drain side when writing, but is on the source side when reading. Therefore, the electric field is eased on the opposite side where charges to be read are stored. As a result, charges flowing channels at the time of reading (minority carriers) are not accelerated on the drain side and high energy is not given so as not to get over potential barrier of the plurality of dielectric films. In this reverse read, electric conductivity of the channel largely changes in accordance with a storing charge amount on the source side, so that the changes are converted to potential changes of the source/drain region. When the potential change, etc. is detected, data stored in the memory cell transistor is read nondestructively.

When erasing data, by using a potential of the first region as a reference, a positive voltage is applied to the source/drain region on the side where the data is written and a negative voltage is applied to the gate. A surface of the source/drain region on the side the data is written becomes depleted due to the application of the above voltages, a bend of the band becomes sharp, and a band-to-band tunneling current is generated. Consequently, charges having an opposite polarity from that of written charges and high energy are generated, accelerated by a vertical electric field, and injected to a part of a plurality of dielectric films wherein the data is written. Accordingly, the threshold voltage changes to carry on erasure.

In the case of an N channel type, a threshold voltage (initial threshold voltage) of a channel-forming region beneath the part written with data of all region of the plurality of dielectric films in an erasing state is higher than a threshold voltage (channel threshold voltage) of other channel-forming region (mainly the first region). Moreover, for being affected by the second region having higher concentration than the first region, the initial threshold voltage varies less than the channel threshold voltage.

When performing writing in this state, the threshold voltage in the writing state varies less than that in the case of writing start up with the channel threshold voltage. Therefore, variation of the threshold voltage after next erasure remains small. By being provided with the second region as above, not only the initial threshold voltage but also that after data writing has preferable convergence property.

Also, even in the case of excessive erasure where the threshold voltage is lower than the initial threshold voltage, there is an allowance up to the point that the threshold voltage of the memory cell transistor becomes equal to or less than the channel threshold voltage. Therefore, when comparing with excessive erasure in the case that the second region is not provided, the threshold voltage varies less.

BRIEF DESCRIPTION OF DRAWINGS

These and other objects and features of the present invention will become clearer from the following description of the preferred embodiments given with reference to the attached drawings, in which:

FIG. 6 is a graph of writing characteristics when writing data respectively to two memory portions by changing the application direction of a writing drain voltage;

DESCRIPTION OF THE PREFERRED EMBODIMENT

Below, embodiments of the present invention will be explained with reference to the drawings by taking as an example a nonvolatile semiconductor memory apparatus having an N channel MONOS type memory transistor.

Figure 1:
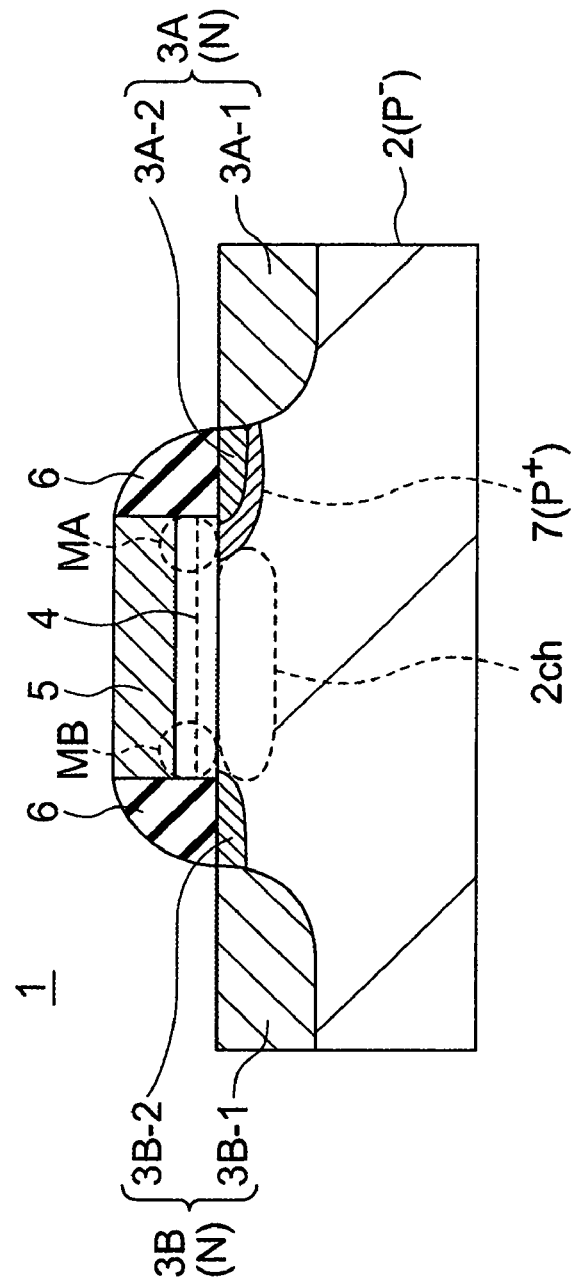
FIG. 1 is a cross-sectional view of a nonvolatile memory cell according to a first embodiment of the present invention.
Figure 2:
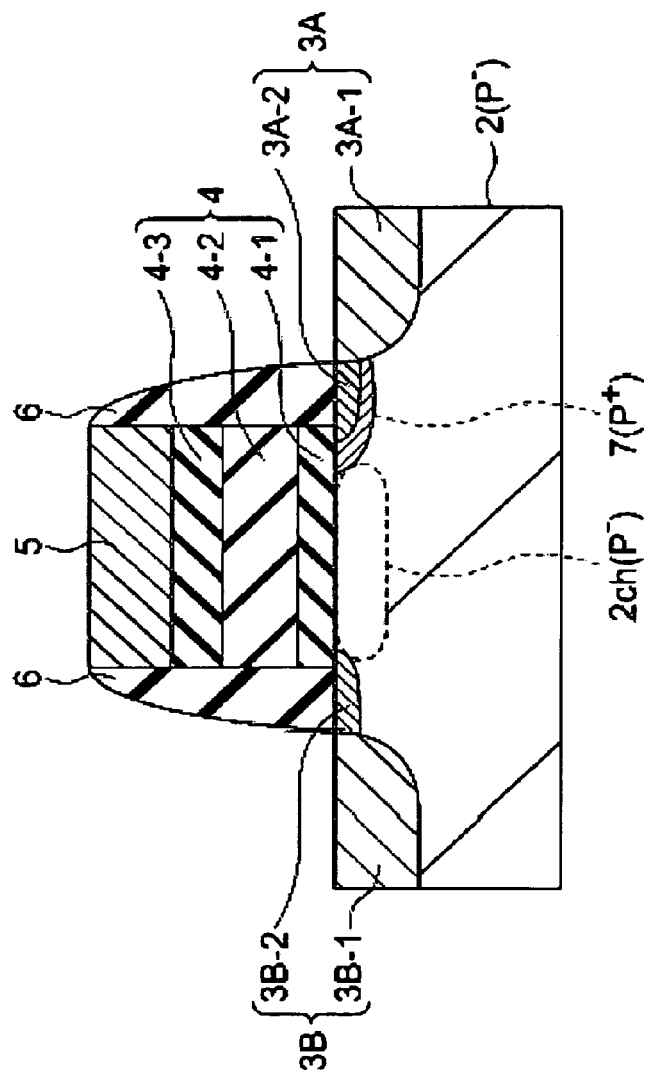
FIG. 2 is an equivalent sectional view to that in FIG. 1 showing an enlarged charge storing film.

FIG. 1 is a sectional view of a nonvolatile memory cell according to an embodiment of the present invention. FIG. 2 is an equivalent sectional view to that in FIG. 1 showing an enlarged charge storing film. This memory cell is composed of one MONOS type memory transistor capable of storing data in a charge trap in an ONO film.

A memory transistor 1 is formed on a substrate 2 made by a P type semiconductor as shown in FIG. 1. The substrate 2 is made by a semiconductor material, such as single-crystal silicon, and provided as a body to be formed a semiconductor element including a memory transistor. There are a variety of forms of the substrate 2 and it may be a P type well or a P type SOI layer formed on a semiconductor substrate other than the P type semiconductor substrate itself.

Two impurity regions (source/drain regions) 3A and 3B obtained by introducing an N type impurity at a high concentration are formed being away from each other on a surface portion of the substrate 2. A surface part 2ch of the substrate 2 between the source/drain regions 3A and 3B configures an embodiment of the "first region" of the present invention. Since the first region 2ch is mainly a region to be formed a channel, it will be referred to as a channel-forming region below.

On the channel-forming region 2ch, a charge storing film 4 having a charge holding ability wherein a plurality of dielectric films are stacked is formed. The charge storing film 4 is, as shown in FIG. 2, composed of a bottom dielectric film 4-1, an intermediate dielectric film 4-2 for mainly storing charges and a top dielectric film 4-3 from the bottom in this order. The bottom dielectric film 4-1 is made, for example, by a silicon dioxide film formed by a thermal oxidization method or a film obtained by performing nitriding processing on a silicon dioxide. The intermediate dielectric film 4-2 is made, for example, by a silicon nitride film, and the top dielectric film 4-3 may be a film formed by performing thermal oxidization on the dielectric film 4-2 or a film formed by chemical vapor deposition (CDV).

A gate electrode 5 is formed on the charge storing film 4. The gate electrode 5 is made by polycrystalline silicon or amorphous silicon added with an impurity.

On both side surfaces of a stacked body of the gate electrode 5 and the charge storing film 4, a sidewall spacer layer 6 made by an insulator having an approximate ¼ circle shaped section is formed.

The source/drain region 3A is composed of an N type impurity region 3A-1 electrically connected to an upper layer wiring layer for not shown bit lines and source lines (or a source electrode or a drain electrode) and an extension region 3A-2 extending toward the channel center from the N type impurity region 3A-1. Similarly, the source/drain region 3B is composed of an N type impurity region 3B-1 electrically connected to a not shown upper layer wiring layer (or a source electrode or a drain electrode) and an extension region 3B-2 extending toward the channel center from the N type impurity region 3B-1. In the impurity configuration called a lightly doped drain (LDD), the extension regions 3A-2 and 3B-2 are formed to have a lower concentration than those of the N type impurity regions 3A-1 and 3B-1 and shallower.

In the present embodiment, a P type impurity region 7 wherein P type impurity concentration is higher than that in the channel-forming region 2ch is formed between one of the two extension regions 3A-2 and 3B-2 (3A-2 in this example) and the channel-forming region 2ch. The P type impurity region 7 is formed for heightening convergence property of an electric field near that and unifying an initial threshold voltage in an erasing state at the time of writing or reading data.

When producing a memory transistor, an element separation insulation layer and well, etc. in accordance with need are formed on the substrate 2 first, and a threshold voltage of the channel-forming region 2ch (hereinafter, referred to as a channel threshold voltage) is set. In the present embodiment, as will be explained later on, the channel threshold voltage does not determine a threshold voltage of the memory transistor.

Next, the bottom dielectric film 4-1, the intermediate dielectric film 4-2 and the top dielectric film 4-3 composing the charge storing film 4 are successively formed by a predetermined film forming method. Also, a conductive film, for example, made by doped polycrystalline silicon is formed. The conductive film and the plurality of dielectric films are subjected to patterning by etching by using as a mask a resist, etc. of the same pattern, and the gate electrode 5 and the charge storing film 4 beneath it are formed. Note that the charge storing film 4 may be at least partially left around the gate.

After removing the resist, by using a multilayer body of the gate as a self aligning mask and using the charge storing film 4 left in accordance with need as a through film, an N type impurity is ion-implanted at a low concentration on the surface of silicon, and $N^-$ type extension regions 3A-2 and 3B-2 are formed. In this ion implantation, for example, arsenic ions ($As^+$) is doped at a density of 1 to $5 \times 10^{13}$ $cm^{-2}$ or so. The concentration of the extension regions may be any, but it is preferably formed sufficiently and at a low concentration to an extent that channel hot electrons are not generated under a condition of a reading operation explained later on.

When the P type impurity region 7 is not provided, an extension region at a high concentration becomes necessary for performing highly efficient channel hot electron (CHE) injection. In the present embodiment, the concentration of the extension region can be lowered while maintaining high efficiency of hot electron injection due to the existence of the P type impurity region 7. As a result, an advantage that disturbance at the time of a reading operation and disturbance against non-selected cells at a writing operation explained later on are suppressed is obtained.

Continuously, in the present embodiment, a layer for masking one extension region (3B-2 in this example), for example, a resist layer is formed, and the other extension region 3A-2 not covered with the mask layer is counter-doped with an impurity of an opposite polarity (P type impurity). When having the charge storing film configuration using 2.0 nm of silicon dioxide as the bottom dielectric film 4-1, 12.0 nm of silicon nitride as the intermediate dielectric film 4-2 mainly performing charge accumulation, and 4.0 nm of silicon dioxide as the top dielectric film 4-3 and using boron as the implantation ion of the substrate 2 for determining the channel threshold voltage Vth (channel), as conditions for the counter doping, it is preferable to form boron difluoride ion $BF_2^+$ of acceleration energy of 30 to 90 keV, a dose amount of $1 \times 10^{13}$ $cm^{-2}$ to $1 \times 10^{14}$ $cm^{-2}$, and the implanting angle of 20 to 50 degrees. Here, the implanting angle indicates an angle that ions are obliquely implanted on the lower side of the gate multilayer body by using as a reference a perpendicular line of the substrate 2. Note that when the implanting angle is large to a certain extent, the P type impurity may be introduced only on one side even without the ion implantation mask layer.

After removing the mask layer of the ion implantation, a $SiO_2$ film is deposited by 100 nm to 200 nm or so by the CVD allover the surface and subjected to etch back by anisotropic etching, such as the RIE. As a result, the sidewall spacer layer 6 is formed on side surfaces of the gate multilayer body.

In this state, ion implantation of an N type impurity is performed at a high concentration on the surface portion of the substrate 2 which is outside the sidewall spacer layer 6, and $N^+$ type impurity regions 3A-1 and 3B-1 of the source/drain regions are formed. In the ion implantation, for example, the gate multilayer body and the sidewall spacer layer 6 are used as a mask and doping is performed by a density of 1 to $5 \times 10^{15}$ $cm^{-2}$ or so in a self aligning way.

After that, in accordance with need, an interlayer dielectric film, a contact and a wiring layer are formed to complete the memory transistor.

Next, the memory cell array configuration applicable to the present embodiment will be explained.

Figure 3:
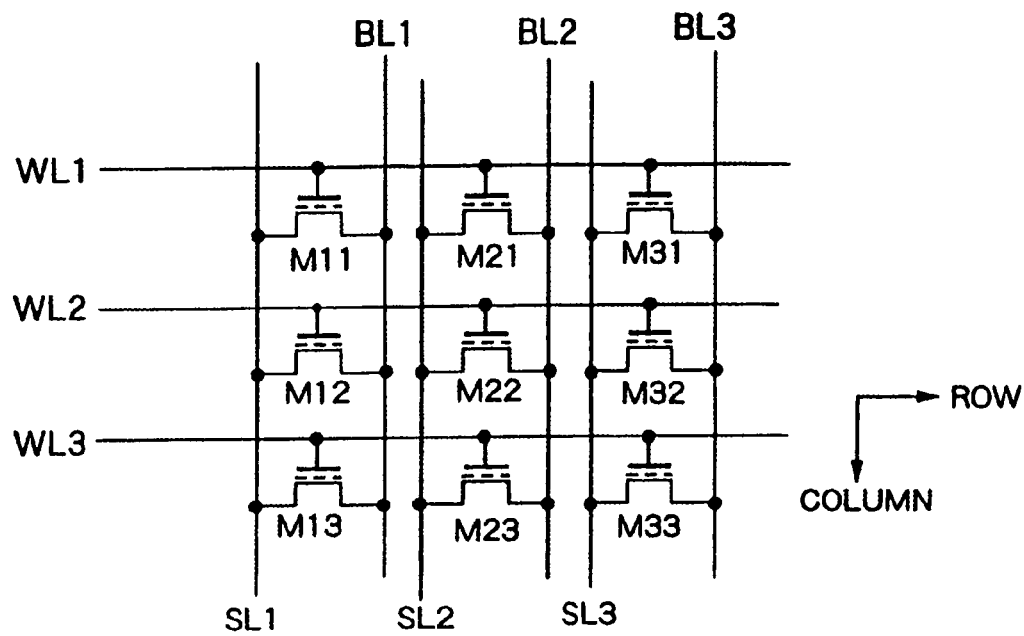
FIG. 3 is an equivalent circuit diagram of a source separation NOR type memory cell array.

FIG. 3 is an equivalent circuit diagram of a source separation NOR type memory cell array.

Memory transistors M11 to M33 composing a memory cell are arranged in matrix and the transistors are wired by word lines, bit lines and separation type source lines.

Respective drains of the memory transistors M11, M12 and M13 lined in the column direction are connected to a bit line BL1, and respective sources are connected to a source line SL1. Respective drains of the memory transistors M21, M22 and M23 lined in the column direction are connected to a bit line BL2, and respective sources are connected to a source line SL2. Respective drains of the memory transistors M31, M32 and M33 lined in the column direction are connected to a bit line BL3, and respective sources are connected to a source line SL3.

Respective gates of the memory transistors M11, M21 and M31 lined in the row direction are connected to a word line WL1. Respective gates of the memory transistors M12, M22 and M32 lined in the row direction are connected to a word line WL2. Respective gates of the memory transistors M13, M23 and M33 lined in the row direction are connected to a word line WL3.

The memory cell array as a whole, the cell arrangement and the connection between the cells shown in FIG. 3 are repeated.

In the memory cell array shown in FIG. 3, when writing or erasing data, memory cells on the same row can be written in parallel in accordance with whether a predetermined drain voltage is set to bit lines, so that collective writing in unit of a page is possible. Note that a detailed operation method will be explained later on.

Figure 4:
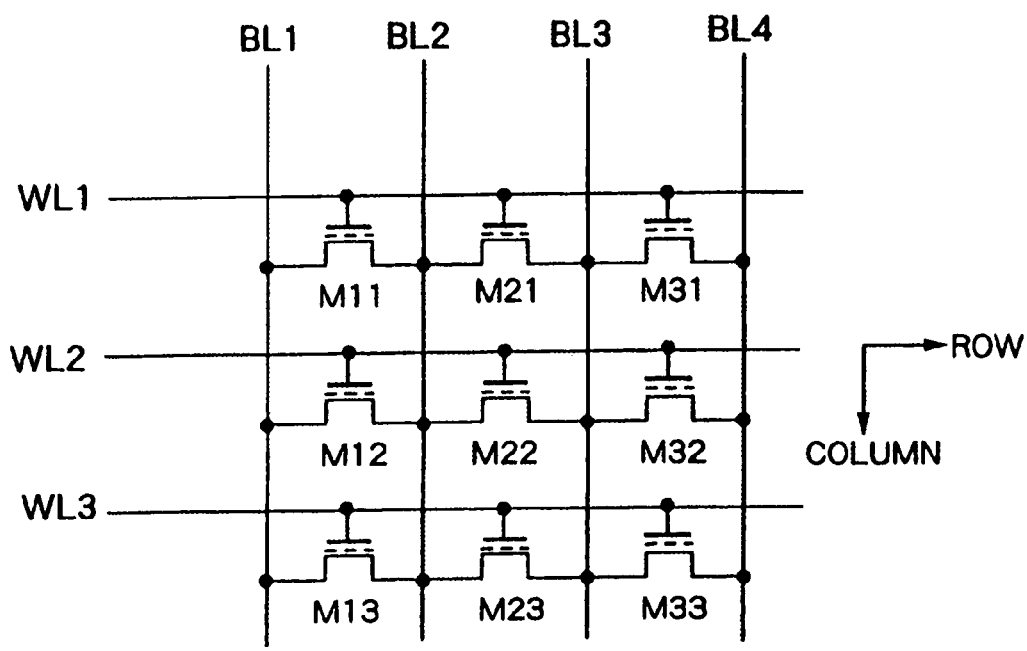
FIG. 4 is an equivalent circuit diagram of a VG type memory cell array wherein source lines are omitted and bit lines are shared by adjacent memory transistor colums.

FIG. 4 is an equivalent circuit diagram of a VG type memory cell array wherein source lines are omitted and bit lines are shared by adjacent memory transistor columns.

The bit line BL2 is shared by the memory transistors M11, M12, M13, . . . on the first row and memory transistors M21, M22 and M23, . . . on the second row. The bit line BL3 is shared by the memory transistors M21, M22, M23, . . . on the second row and memory transistors M31, M32 and M33, . . . on the third row. The bit lines BL1, BL2, BL3, BL4, . . . are formed by impurity regions.

In the memory cell array shown in FIG. 4, collective writing in unit of a page is not possible and a writing operation for every bit or a plurality of times of writing operations are necessary for one page.

Next, a charge injection operation of the memory cell will be explained.

Figure 5A:
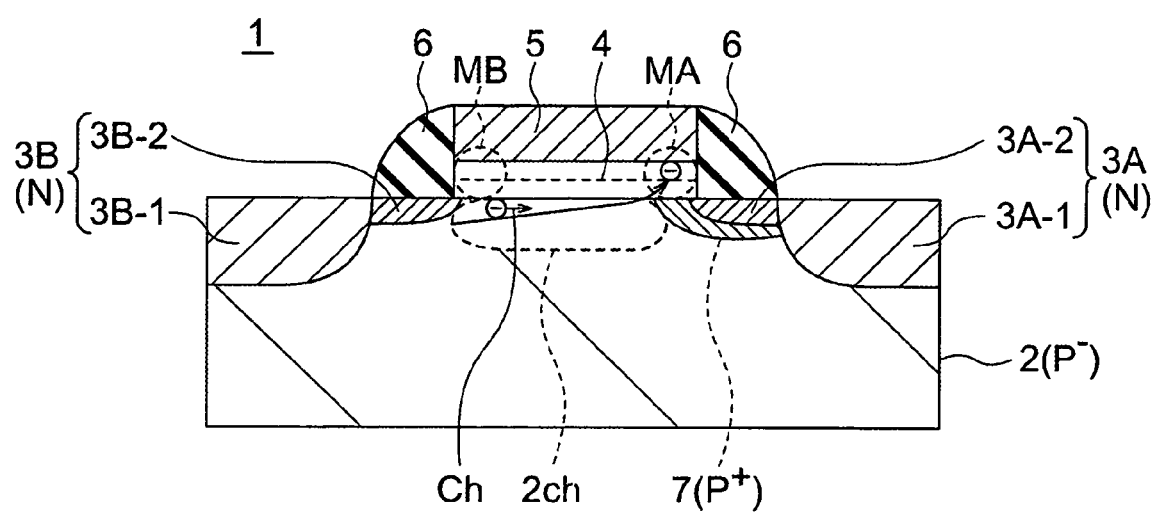
FIG. 5A is a schematic view of a charge injection operation.
Figure 5B:
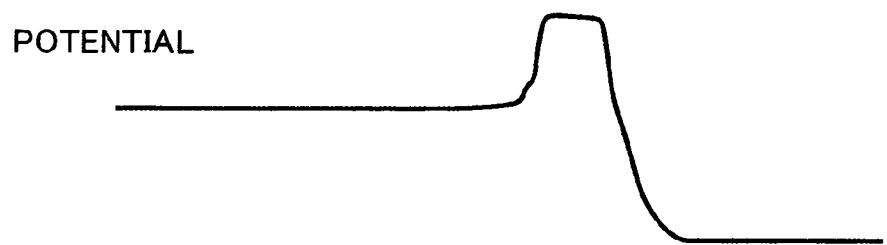
FIG. 5B and FIG. 5C are views of potential in the channel direction and an electric field distribution at the time of writing.

FIG. 5A shows a schematic view of a charge injection operation. Also, FIG. 5B and FIG. 5C shows a potential in the channel direction and an electric field distribution at the time of writing.

In FIG. 5A, the substrate 2 is a P type semiconductor, the impurity regions 3A-1 and 3B-1 and extension regions 3A-2 and 3B-2 composing the source/drain regions are N type semiconductor and electrons are injected to the memory portion MA.

First, in a state of holding the source/drain region 3B to be a source and the substrate 2 at a reference voltage of 0V, a writing drain voltage Vd of, for example, 3.0V is applied to the source/drain region 3A to be a drain and a predetermined positive voltage (writing gate voltage Vg) of, for example, 5.0V is applied to the gate electrode 5.

Figure 5C:
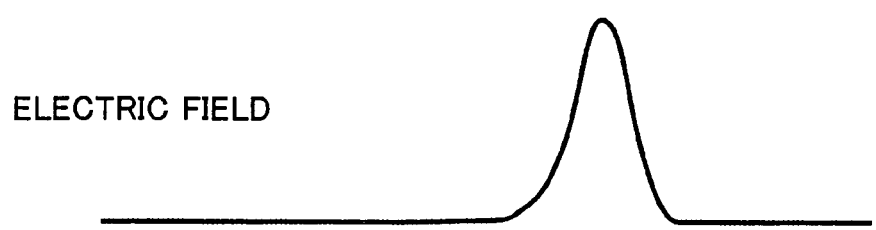

Under this condition, as shown in FIG. 5C, an electric field is generated by the writing drain voltage Vd and the writing gate voltage Vg, but a potential difference becomes large (FIG. 5B) due to a region 7 with a higher impurity density than that in the substrate 2 and the electric field becomes strong at the channel end of the drain side.

As a result, electrons supplied to the inversion layer (channel) CH of minority carriers from the source/drain region 3B become hot electrons at the channel end of the drain side, get over a potential barrier of the bottom dielectric film 4-1 and injected in the charge storing film 4.

At this time, since the P type impurity region 7 is not formed on the source/drain region 3B side to be a source, a potential difference at the channel end of the source side is small and the electric field is not strong enough to cause injection of charges, so that charges are not injected in the memory portion MB.

In FIG. 6, as an example of the present embodiment, writing characteristics under a condition that a drain voltage Vd is 3.0V and a gate voltage Vg is 5.0V are shown respectively in the case of writing data in the memory portion MB and in the case of writing data in the memory portion MA by switching an object to be applied with the writing drain voltage Vd. In FIG. 6, the abscissa axis indicates a voltage application time (write pulse duration) and the ordinate axis indicates a shift amount (Vth shift) of a threshold voltage of the memory transistor.

It is learnt from FIG. 6 that the threshold voltage Vth shifts at a high speed of 1 ms or so in writing to the memory portion MA on the P type impurity region 7 existing side.

On the other hand, in writing to the memory portion MB on the side where the P type impurity region 7 does not exist, the threshold voltage Vth does not shift. This indicates that in the case of reading data written on the drain side by the reverse read method, the drain side at the time of reading (the source side at the time of writing) is configured not to perform an effective writing operation as above, so that writing to the memory portion MB is not performed no matter how long the time is set. When writing to the memory portion MB, a potential changes on the source side and electric field energy in the lateral direction is consumed thereby, so the electric field does not become strong enough to generate hot electrons on the desired drain side.

Figure 7:
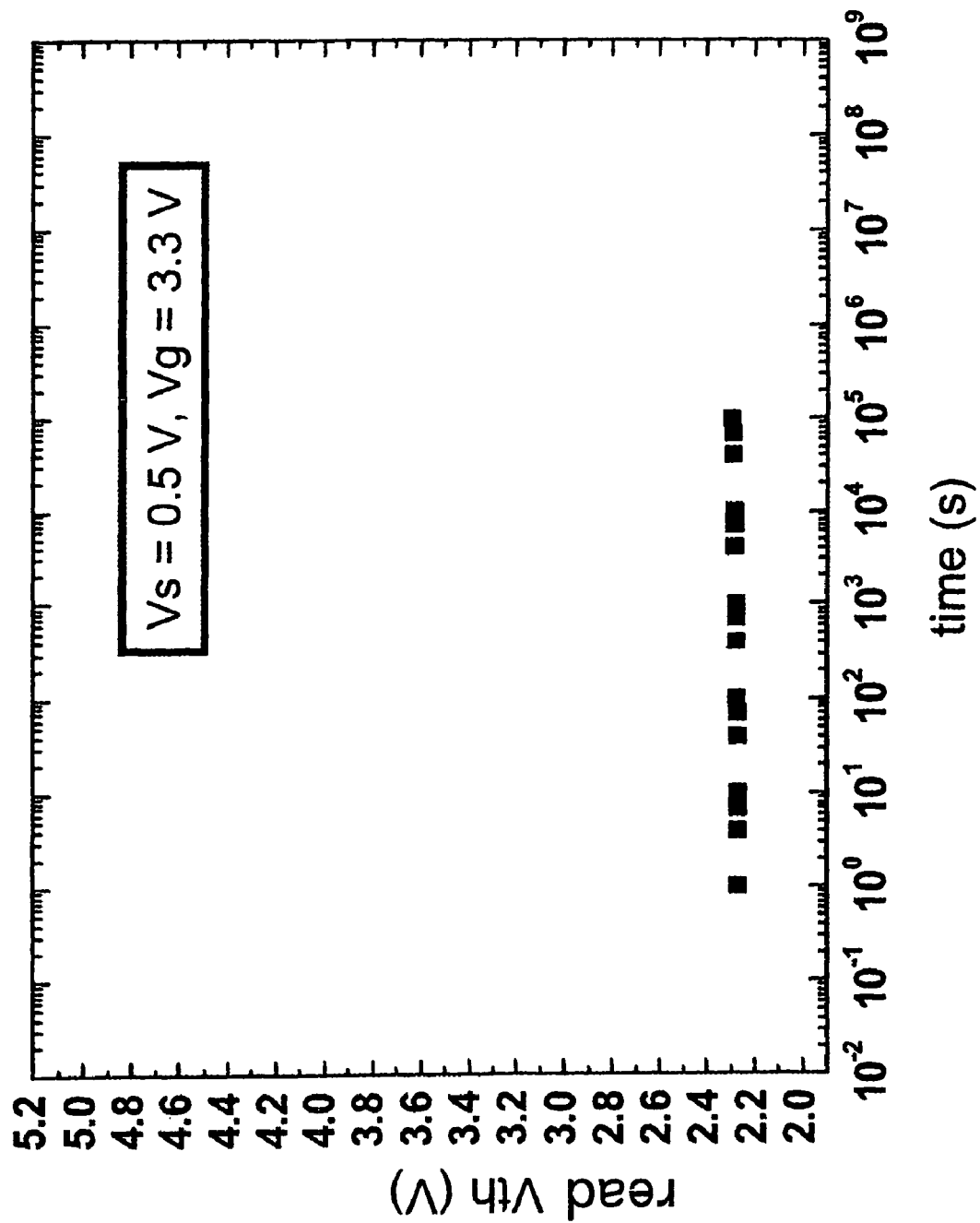
FIG. 7 is a graph of read disturbance characteristics of a memory portion MB in the case of successively repeating writing to a memory portion MA.

In FIG. 7, read disturbance characteristic of the memory portion MB in the case of successively repeating the writing to the memory portion MA is shown. In FIG. 7, a total writing time is changed from one second to $10^5$ seconds, and a relationship of the writing time and a threshold voltage (read Vth) of the memory portion MB read in each time is shown. At this time, the source voltage is 0.5V and the gate voltage is 3.3V.

It is learnt from FIG. 7 that considerably high disturbance resistance is obtained because writing to the memory portion MA does not affect the threshold to the memory portion MB.

Next, an erasing operation of the memory cell will be explained.

In a first erasing method, hot holes caused by a band-to-band tunneling current are injected from the drain side.

Figure 8:
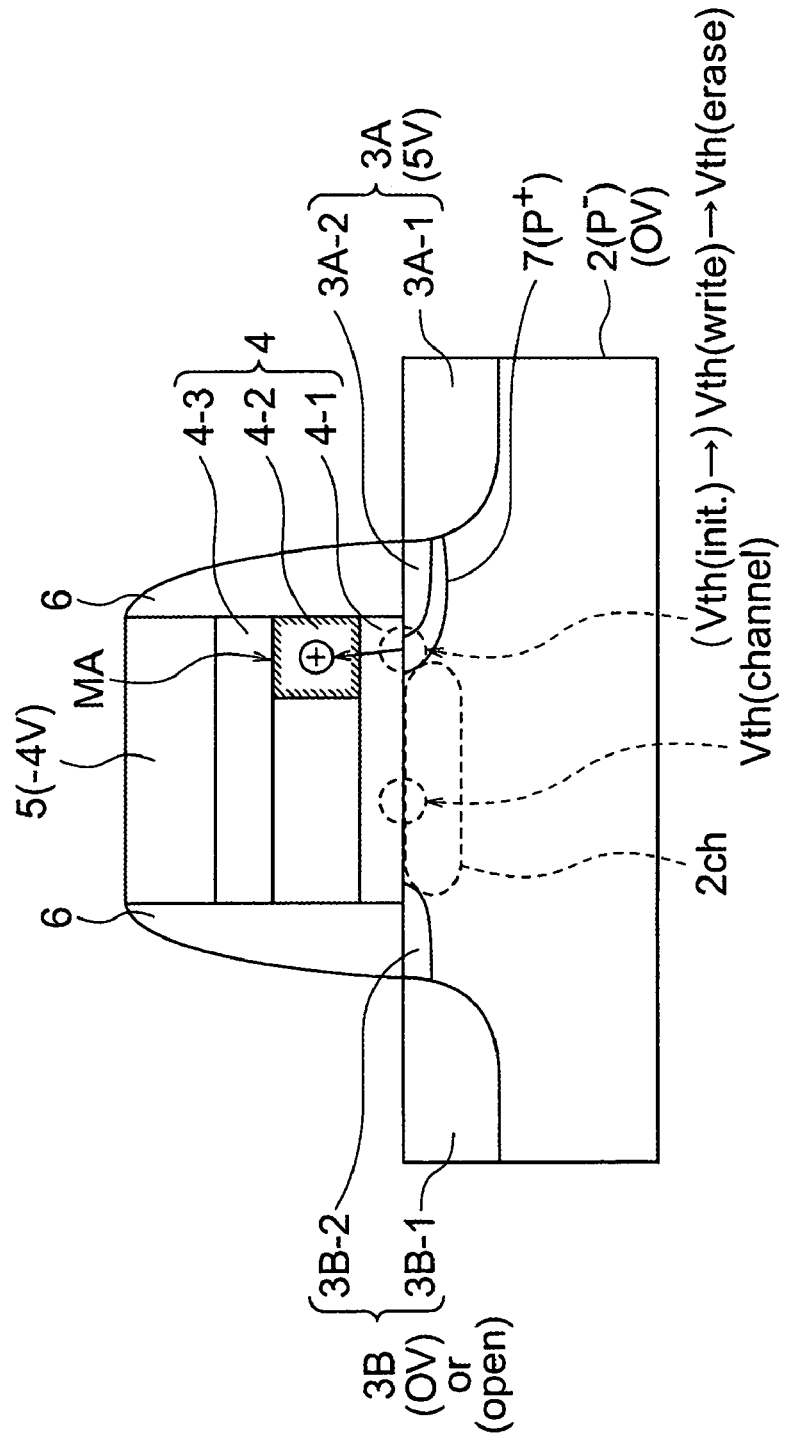
FIG. 8 is a schematic view at the time of erasing by a first method.

FIG. 8 shows a schematic view at the time of erasing by the first method.

By using a potential (0V) of the substrate 2 (channel-forming region 2ch) as a reference, a positive voltage of, for example, 5V is applied to the source/drain region 3A on the memory portion MA side written with data and a negative voltage of, for example, −4V is applied to the gate voltage 5.

Under this condition, the surface of the source/drain region 3A on the memory portion MA side written with data becomes depleted and a bend of the band becomes sharp, so that a band-to-band tunneling current is generated. As a result, as shown in FIG. 8, charges (hot holes) having an opposite polarity from that of written charges (electrons) and high energy are generated, accelerated by a vertical electric field and injected to a part (the memory portion MA) of the plurality of dielectric films written with data. Consequently, stored electrons are electrically cancelled by the injected holes and the threshold voltage is lowered, so that stored data is erased.

In the present embodiment, since the P type impurity region 7 is formed, the initial threshold voltage Vth(init.) immediately after the production is set higher than the threshold voltage Vth(channel) of the channel-forming region 2ch and changes to the threshold voltage Vth(write) after writing "1". It is preferable that erasure of data is performed from this state and the threshold voltage is changed to the initial threshold voltage Vth(init.) or less.

In the present embodiment, the initial threshold voltage Vth(init.) of the memory transistor depends on a concentration profile of the P type impurity region 7. When erasing by injecting hot holes to the writing region (memory region MA), the threshold voltage Vth(erase) after the erasure can be made lower than the initial threshold voltage Vth(init.) because there is a difference from the threshold voltage Vth(channel) of the channel-forming region 2ch.

The relationship of the threshold voltage is shown in FIG. 8 and the formula (1) below.

$$Vth(init.) \geq Vth(erase) > Vth(channel) \qquad (1)$$

Figure 9:
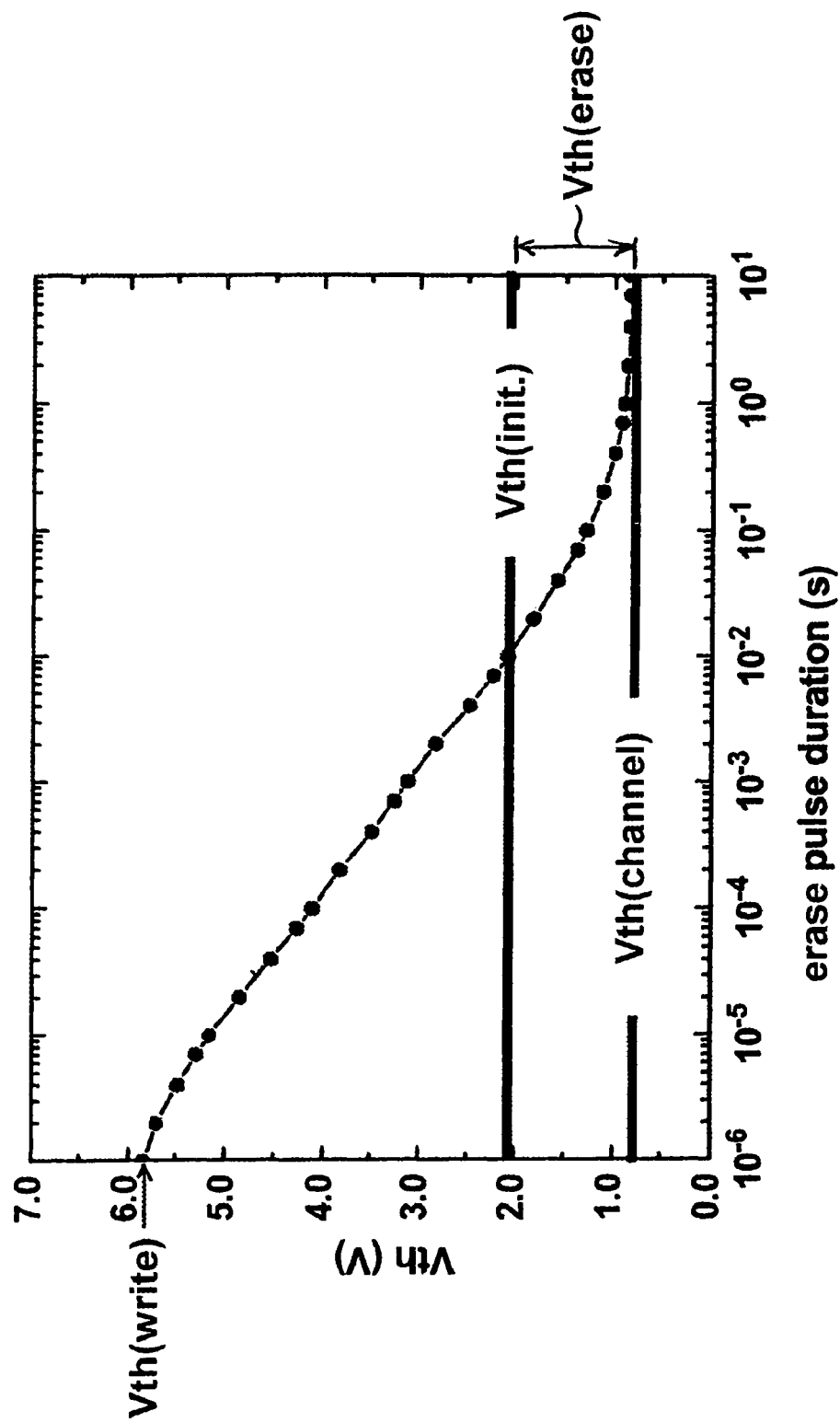
FIG. 9 is a graph showing erasing characteristics of a memory transistor by the first method.

FIG. 9 shows an example of erasing characteristics of the memory transistor. The abscissa axis indicates a voltage application time (erasure pulse duration) and the ordinate axis indicates the threshold voltage of the memory transistor in FIG. 9. Note that the application voltage of the gate electrode is −5V in measurement for obtaining FIG. 9.

The channel threshold voltage Vth(channel) is set at 0.8V in the example shown in FIG. 9. The channel threshold voltage Vth(channel) has a low channel concentration, is set on the initial stage of production process of the transistor and easily varies by being affected by thermal transition of processes after that.

On the other hand, the initial threshold voltage Vth(init.) immediately after the production set at about 2V in the example shown in FIG. 9 is determined by the concentration profile of the P type impurity region 7, and the formation process of the P type impurity region 7 comes after formation of the charge storing film 4 wherein particularly high temperature processing is performed for many times, thus, it is hard to vary by the thermal transition. Also, since the P type impurity region 7 itself has a higher concentration than that of the channel-forming region 2ch, the convergence property of the initial threshold voltage Vth(init.) is good from the beginning and a sharp distribution is obtained. Accordingly, the threshold voltage Vth(write) which becomes about 5.8V after writing "1" has more favorable convergence property than that in the case of writing by using the channel threshold voltage Vth(channel) as the initial threshold voltage. The threshold voltage is lowered by erasure for depending on the erasure time as shown in FIG. 9, but the erasing threshold voltage Vth(erase) is preferably at the initial threshold voltage Vth(init.) or less, so that the control is easy.

Figure 10:
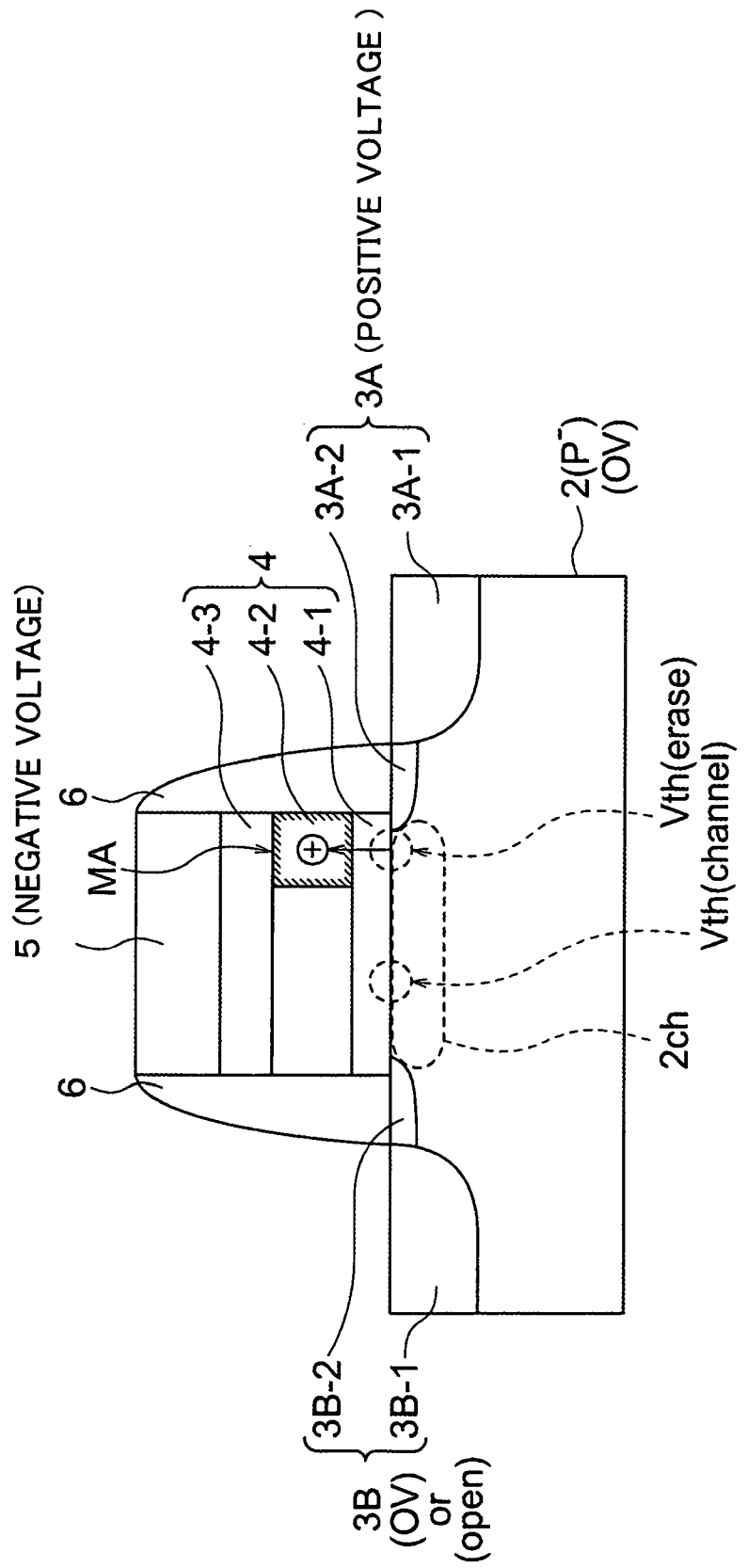
FIG. 10 is a schematic view at the time of erasing in the case of not provided with a P-type impurity region as a comparative example.

FIG. 10 is a schematic view at the time of erasing in the case of not provided with the P type impurity region 7 as a comparative example.

Also in the comparative example, when applying a positive voltage to the source/drain region 3A and a negative voltage to the gate electrode 5 by using the potential (0V) of the substrate 2 as reference, hot holes caused by band-to-band tunneling are injected to the memory portion MA and stored data is erased.

Note that when the P type impurity region 7 is not provided, the initial threshold voltage Vth(init.) is approximately the same as the threshold voltage Vth(channel) of the channel-forming region 2ch. When the erasure operation is not sufficient, the threshold voltage Vth(erase) after erasing in the memory transistor becomes a threshold voltage (>Vth (init.)=Vth(channel)) which is a lowered threshold voltage Vth(write) of writing "1" in the region being written (the memory portion MA). On the other hand, when erasure is sufficiently done, at least a part of the threshold voltage Vth(erase) after the erasure becomes lower than the initial threshold voltage Vth(init.), that is, the channel threshold voltage Vth(channel) on a wafer surface or in a memory cell array. It is because variation of the channel threshold voltage Vth(channel) is large.

The relationship of the threshold voltage is shown in FIG. 10 and the formula (2) below.

$$Vth(init.)=Vth(channel)>Vth(erase) \qquad (2)$$

When the P type impurity region 7 is not provided as in the comparative example, variation of the initial threshold voltage is large, moreover, the threshold voltage after erasing becomes lower than the channel threshold voltage Vth (channel), so that threshold control for erasing is difficult.

In a second erasing method, accumulation electrons are drawn allover the channel by FN tunneling.

Figure 11:
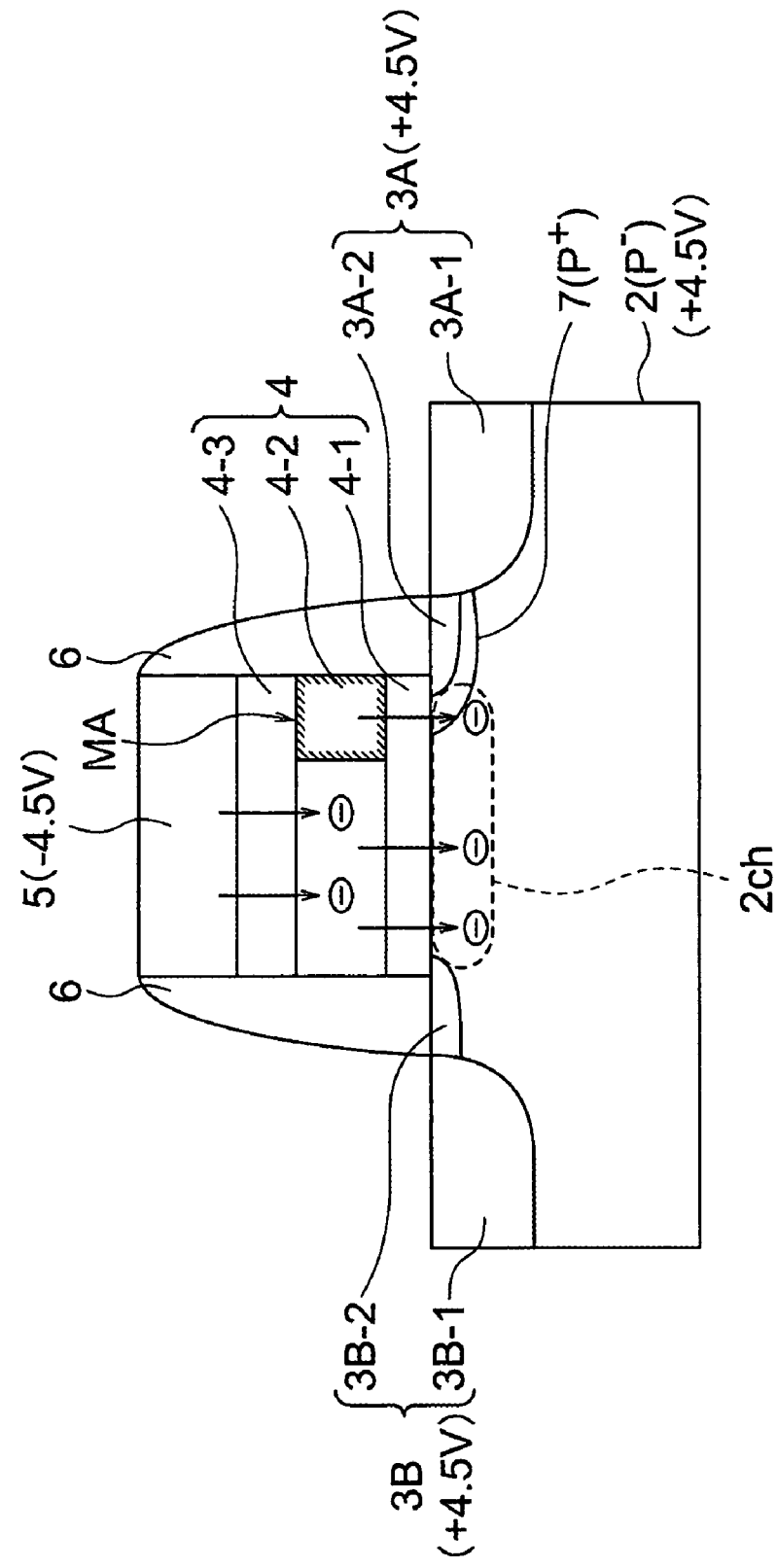
FIG. 11 is a schematic view at the time of erasing by a second method.

FIG. 11 is a schematic view at the time of erasing by the second method.

A positive voltage of, for example, 4.5V is applied to two source/drain regions 3A and 3B and the substrate 2, and a negative voltage of, for example, −4.5V is applied to the gate. As a result, stored electrons of the memory portion MA moves to the substrate side by FN tunneling. Although electrons are successively drawn from regions other than the memory portion in some cases, electrons are injected from the gate electrode 5 at the same time with that, so that electric balance is maintained. Consequently, stored data is erased.

According to the embodiment of the present invention, effects below can be obtained.

For example, in the case of an N type channel, a P type impurity region 7 of the same conductive type as the channel-forming region 2ch and having higher concentration is provided on either one of the source/drain regions 3A and 3B, for example, on the 3A side.

Therefore, efficiency of hot electron injection at the time of writing is improved and the writing voltage can be made low. As a result, it is not necessary to form a transistor having a high breakdown voltage in peripheral circuits and the production process can be simplified.

Also, due to the existence of the P type impurity region 7, the concentration of the extension regions can be lowered while maintaining the high efficiency of injecting hot electrons. As a result, an advantage that disturbance that weak writing occurs during a reading operation by an application condition of a reading operation voltage when reading and disturbance against non-selected cells at the time of a writing operation is obtained.

Furthermore, variation of the initial threshold voltage of the memory transistor becomes small, and convergence property of the threshold voltage after writing and that after erasing are improved. It is possible to prevent the threshold voltage after erasing from becoming lower than the channel threshold voltage, and a range of setting the erasing threshold voltage is widened and control becomes easy.

The P type impurity region 7 giving a variety of advantages as above is formed by counter doping for performing ion implantation of a P type impurity successively after ion implantation of N type impurity at the time of forming the extension regions. When an angle of the ion implantation of a P type impurity is made large to a certain extent, the P type impurity can be formed only on one side without forming a mask layer. In that case, adding of a photomask is not necessary and an increase of processes is a little, so that a large increase of costs is not caused thereby.

On the other hand, when a P type impurity region is provided by the counter doping, etc. on both the drain side and the source side so as to generate a high electric field at the channel end of the drain side, it is necessary to raise the gate voltage to obtain a writing voltage and to lower the potential of a region with a high threshold voltage on the source side at the time of the writing operation. As a result, a potential difference on the drain side becomes small and writing efficiency is hard to be improved.

In the present embodiment, by providing the P type impurity only on the side to be a drain at the time of writing, such factors of hindering an improvement of the writing efficiency are removed, consequently, a wide improvement of writing characteristics can be attained.

As explained above, it became possible to perform all operations of writing, reading and erasing with a voltage of 5V or less.

According to the present invention, it becomes possible to set a voltage low when writing data, charges are not injected to unnecessary parts when reading, and a threshold voltage level can be unified when erasing.

The embodiments explained above are for easier understanding of the present invention and not to limit the present invention. Accordingly, respective elements disclosed in the above embodiments includes all modifications in designs and equivalents belonging to the technical field of the present invention.

What is claimed is:

1. A nonvolatile semiconductor memory apparatus including a memory transistor, comprising:
   a first conductive type semiconductor region;
   two source/drain regions in a surface portion of said first conductive type semiconductor region in spaced-apart relation and comprising a second conductive type semiconductor;
   a plurality of dielectric films stacked directly on said first conductive type semiconductor region without any intersecting layers in a position between said two source/drain regions; and
   a gate electrode formed on said plurality of dielectric films;
   wherein,
   said first conductive type semiconductor region between said two source/drain regions includes:
      first region wherein a channel is formed by an inversion layer of minority carrier; and
      a second region formed between said first region and a source/drain region on one side of the first region and having higher impurity concentration than that of said first region; and
   charges can be transferred to and retained within said plurality of dielectric layer.

2. A nonvolatile semiconductor memory apparatus as set forth in claim 1, comprising:
   a memory cell array wherein a plurality of memory transistors provided with said first region, said second region, said two source/drain regions, said plurality of dielectric films and said gate electrode are arranged in matrix;
   and wherein
   said two source/drain regions are respectively shared by said memory transistors in the row direction, and said second region is formed on one side in the row direction of the respective shared source/drain regions in said memory cell array.

3. A nonvolatile semiconductor memory apparatus, comprising:
   a first conductive type semiconductor region;
   two source/drain regions in a surface portion of said first conductive type semiconductor region in spaced-apart relation and comprising a second conductive type semiconductor;
   a plurality of dielectric films stacked on said first conductive type semiconductor region in a position between said two source/drain regions; and
   a gate electrode formed on said plurality of dielectric films;
   wherein,
   said first conductive type semiconductor region between said two source/drain regions includes:
      a first region wherein a channel is formed by an inversion layer of minority carrier; and
      a second region formed between said first region and a source/drain region on one side of the first region and having higher impurity concentration than that of said first region, and
   wherein,
   said source/drain regions comprises a second conductive type impurity region and a second conductive type extension region formed between the second conductive type impurity region and said second region; and
   second conductive type impurity concentration of said extension region is lower than second conductive type impurity concentration of the extension region in the case of not provided with said second region.

4. A method of operating a nonvolatile semiconductor memory apparatus comprising a first conductive type semiconductor region; two source/drain regions formed in a surface portion of said first conductive type semiconductor region in spaced-apart relation and made of a second conductive type semiconductor; a plurality of dielectric films stacked on a portion of said first conductive type semiconductor region between said two source/drain regions; and a gate electrode formed on said plurality of dielectric films, wherein said first conductive type semiconductor region between said two source/drain regions includes a first region in which a channel formed by an inversion layer of minority carrier, and a second region formed between said first region and a source/drain region on one side of the first region and having higher concentration than that of said first region, said method comprising the steps of:
   when writing data, by using a potential of a source/drain region on said first region side among said two source/drain regions as a reference, applying a writing drain voltage to a source/drain region on said second region, applying a writing gate voltage to said gate electrode, and injecting minority carriers accelerated in said channel and energetically excited near an end portion of said second region to a part of said plurality of dielectric films near an upper portion of said second region; and
   when reading data, by using a potential of the source/drain region on said second region side as a reference, applying a reading drain voltage to the other source/drain region on said first region side, applying a reading gate voltage to said gate electrode, and reading a change of electric conductivity of different channel in accordance with whether said minority carriers are sufficiently injected to a part of said plurality of dielectric films at the time of said writing data.

5. A method of operating a nonvolatile semiconductor memory apparatus comprising a first conductive type semiconductor region; two source/drain regions formed in a surface portion of said first conductive type semiconductor region in spaced-apart relation and made of a second conductive type semiconductor; a plurality of dielectric films stacked on a portion of said first conductive type semiconductor region between said two source/drain regions; and a gate electrode formed on said plurality of dielectric films, wherein said first conductive type semiconductor region between said two source/drain regions includes a first region in which a channel is formed by an inversion layer of minority carrier, and a second region between said first region and a source/drain region on one side of the first region and having higher concentration than that of said first region, said method comprises the steps of:

when writing data, by using a potential of a source/drain region on said first region side among said two source/drain regions as a reference, applying a writing drain voltage is applied to a source/drain region in said second region, applying a writing gate voltage to said gate electrode, and injecting minority carriers accelerated in said channel and energetically excited near an end portion of said second region are injected to a part of said plurality of dielectric film near an upper portion of said second region; and when erasing data, by using a potential of said first region as a reference, applying a positive voltage to the source/drain region on said second region side, applying a negative voltage to said gate electrode, injecting charges generated by a band-to-band tunneling current on the source/drain region side on said second region side, energetically excited and having an opposite polarity from that of said minority carriers to a part of said plurality of dielectric films to which said minority carriers are injected at least at the time of said writing data.

6. The method of operating a nonvolatile semiconductor memory apparatus as set forth in claim 5, wherein:

when reading data, by using a potential of said source/drain region on said second region side as a reference, a writing drain voltage is applied to the other source/drain region on said first region side, a reading gate voltage is applied to said gate electrode, and a change of electric conductivity of a different channel is read in accordance with whether said minority carriers are sufficiently injected to a part of said plurality of dielectric films at the time of said writing data.

* * * * *